US009506752B2

(12) United States Patent  
Kuo et al.

(10) Patent No.: US 9,506,752 B2
(45) Date of Patent: Nov. 29, 2016

(54) EXPLOSION-PROOF DUST OF ELECTROMECHANICAL LEVEL MEASURING DEVICE

(71) Applicant: FINETEK Co., Ltd., New Taipei (TW)

(72) Inventors: Ching-Cheng Kuo, New Taipei (TW); Yun-Lung Lo, New Taipei (TW); Yi-Liang Hou, New Taipei (TW); Chao-Kai Cheng, New Taipei (TW)

(73) Assignee: FINETEK CO., LTD., New Taipei (TW)

( * ) Notice: Subject to any disclaimer, the term of this patent is extended or adjusted under 35 U.S.C. 154(b) by 283 days.

(21) Appl. No.: 14/533,102

(22) Filed: Nov. 5, 2014

(65) Prior Publication Data

US 2016/0123733 A1    May 5, 2016

(51) Int. Cl.
| | |
|---|---|
| *G01C 9/12* | (2006.01) |
| *G01F 23/00* | (2006.01) |
| *H02B 1/28* | (2006.01) |
| *H05K 7/14* | (2006.01) |

(52) U.S. Cl.
CPC ............. *G01C 9/12* (2013.01); *G01F 23/0023* (2013.01); *H02B 1/28* (2013.01); *H05K 7/1462* (2013.01)

(58) Field of Classification Search
CPC ......... G01C 9/12; G01D 11/24; G01D 5/142
USPC ...................................................... 33/366.11
See application file for complete search history.

(56) References Cited

U.S. PATENT DOCUMENTS

| | | | | |
|---|---|---|---|---|
| 4,083,226 A * | 4/1978 | Eckstein | .................. | G01N 1/24 73/31.05 |
| 4,260,918 A * | 4/1981 | Engle | .................... | H02K 5/132 310/68 B |
| 4,732,526 A * | 3/1988 | Nakashima | .............. | B25J 9/046 310/88 |
| 4,814,651 A * | 3/1989 | Elris | ...................... | H02K 21/22 310/156.22 |
| 5,233,248 A * | 8/1993 | Kawamura | ........... | H02K 1/185 310/156.25 |
| 5,753,986 A * | 5/1998 | Ohtani | .................. | H02K 5/136 310/52 |
| 6,392,322 B1 * | 5/2002 | Mares | ................... | H02K 53/00 310/121 |
| 2007/0056307 A1 * | 3/2007 | Caggiano | .............. | B01D 53/06 62/271 |
| 2013/0285493 A1 * | 10/2013 | Paone | ................... | H02K 7/104 310/77 |
| 2016/0109874 A1 * | 4/2016 | Holmes | ................ | G05B 19/406 700/275 |
| 2016/0123733 A1 * | 5/2016 | Kuo | ........................ | G01C 9/12 33/366.11 |

\* cited by examiner

*Primary Examiner* — Yaritza Guadalupe-McCall
(74) *Attorney, Agent, or Firm* — HDLS IPR Services; Chun-Ming Shih

(57) ABSTRACT

An explosion-proof dust of electromechanical level measuring device includes: a explosion proof enclosure (100), formed with a safe chamber area (101) and a hazardous chamber area (102) and a power shaft sleeve (120) is provided for communicating the above two; a power unit (200) disposed inside the safe chamber area (101); a control module (300) disposed inside the safe chamber area (101) and electrically connected to the power unit (200); a capstan (400) disposed in the hazardous chamber area (102); a power shaft (500) sleeved in the power shaft sleeve (120) and two ends thereof are respectively connected to the power unit (200) and the capstan (400); and a pair of bearings (610, 620) disposed in the power shaft (120) and spaced with an interval thereby forming a fireproof path (601).

10 Claims, 11 Drawing Sheets

EXPLOSION-PROOF DUST OF ELECTROMECHANICAL LEVEL MEASURING DEVICE

BACKGROUND OF THE INVENTION

Field of the Invention

The present invention relates to an electromechanical level measuring device, especially to an explosion-proof dust of electromechanical level measuring device.

Description of Related Art

A conventional storage level measuring mechanism utilizing plumb weight is mainly installed at the top of a large storage tank stored with raw materials such as powders, particles or block-shaped objects, the structure thereof is consisted of a housing fastened on the top surface of the storage tank, a transmission wheel disposed in the housing, and a plumb cable reeled on each pulley, one end of the plumb cable is provided with a plumb weight, and a motor is used for driving the transmission wheel to rotate, the motor is preferably to be controlled by a circuit board, thereby enabling the plumb cable to be operated for being reeled or released.

When being operated, the motor is actuated for allowing the plumb cable to be gradually released, and the plumb weight is served to pull the plumb cable for allowing the plumb weight to be gradually moved towards the bottom of the storage tank, when the plumb weight is in contact with the storing objects stored in the storage tank, the level of the storing objects in the storage tank is able to be calculated with respect to the length of the released plumb cable thereby providing a reference to the user.

Because the above-mentioned raw materials are mostly small particles, suspended powders or debris are very likely to be generated, and the electrically-charged powders or debris may rub against each other so static electricity would be generated and the powers or debris may by ignited. The above-mentioned motor and the circuit board are both capable of generating high temperature or sparks, the suspended powders or debris inside the storage tank may be ignited because of the high temperature or the sparks, so the situation of the raw material being mutually stored in the storage tank with the powders or debris is dangerous.

Accordingly, the applicant of the present invention has devoted himself for improving the mentioned disadvantages.

SUMMARY OF THE INVENTION

The present invention is to provide an explosion-proof dust of electromechanical level measuring device, which is formed with a fireproof path.

The present invention is to provide an explosion-proof dust of electromechanical level measuring device, which includes an explosion proof enclosure, a power unit, a control module, a capstan, a power shaft and a pair of bearings. The explosion proof enclosure is provided with a partition plate, two sides defined by the partition plate in the explosion proof enclosure are respectively formed as a safe chamber area and a hazardous chamber area, and the partition plate is provided with a power shaft sleeve which penetrates the partition plate thereby communicating the safe chamber area and the hazardous chamber area. The power unit is disposed inside the safe chamber area. The control module is disposed inside the safe chamber area, disposed adjacent to the power unit and electrically connected to the power unit. The capstan is disposed inside the hazardous chamber area. The power shaft is sleeved in the power shaft sleeve, and two ends thereof are respectively connected to the power unit and the capstan. The bearings are disposed in the power shaft sleeve and respectively sleeved with the power shaft, and the bearings are spaced with an interval thereby forming a fireproof path.

In the above-mentioned explosion-proof dust of electromechanical level measuring device, a bearing sleeve is disposed in the power shaft sleeve and two ends thereof are respectively abutted against each of the bearings. A surface of the power unit is provided with a magnet, and the control module is correspondingly provided with a Hall sensor. The power unit is able to be rotated along the power shaft, the safe chamber area is provided with a pair of position limiting units, and the power unit is provided with a position limiting plate, wherein a part of the position limiting plate is arranged between the position limiting units. The interior of the safe chamber area is provided with a recovery spring, and two ends of the recovery spring are respectively connected to the position limiting plate and an inner wall of the safe chamber area.

In the above-mentioned explosion-proof dust of electromechanical level measuring device, the explosion proof enclosure is provided with an explosion proof cable gland electrically connected to the control module, wherein the exterior of the explosion proof enclosure is further provided with a wireless module electrically connected to the control module.

In the above-mentioned explosion-proof dust of electromechanical level measuring device, a measuring cable and a counting wheel are further provided, the explosion proof enclosure is formed with a cable outlet communicated with the hazardous chamber area, one end of the measuring cable is reeled on the capstan, and the measuring cable is reeled on the counting wheel and passes the cable outlet for being protruded out of the explosion proof enclosure, the other end of the measuring cable is provided with a plumb weight, the counting wheel is pivoted in the hazardous chamber area, the counting wheel is provided with a plurality of annularly-arranged magnets, and the magnets are able to be circularly moved when the counting wheel is rotated, and the control module is provided with a Hall sensor corresponding to the moving path of the magnets.

In the above-mentioned explosion-proof dust of electromechanical level measuring device, a sensing module is further provided and disposed outside the explosion proof enclosure, the sensing module includes a flange assembly and a slide assembly, and two ends of the flange assembly are opened and one end thereof is communicated with the cable outlet, the slide assembly is slidably sleeved in the flange assembly and allows the measuring cable to pass, one end of the slide assembly is provided with a magnet capable of being moved with the slide assembly into the hazardous chamber area, the control module is provided with a Hall sensor corresponding to the magnet. The sensing module further includes a scraper served to shield the other end of the flange assembly and allowing the slide assembly to penetrate.

According to the explosion-proof dust of electromechanical level measuring device provided by the present invention, the fireproof path is formed between the safe chamber area and the hazardous chamber area, thereby preventing the powders or debris generated by the storing objects from entering the safe chamber area through the hazardous chamber area.

DETAILED DESCRIPTION OF THE INVENTION

Figure 1:
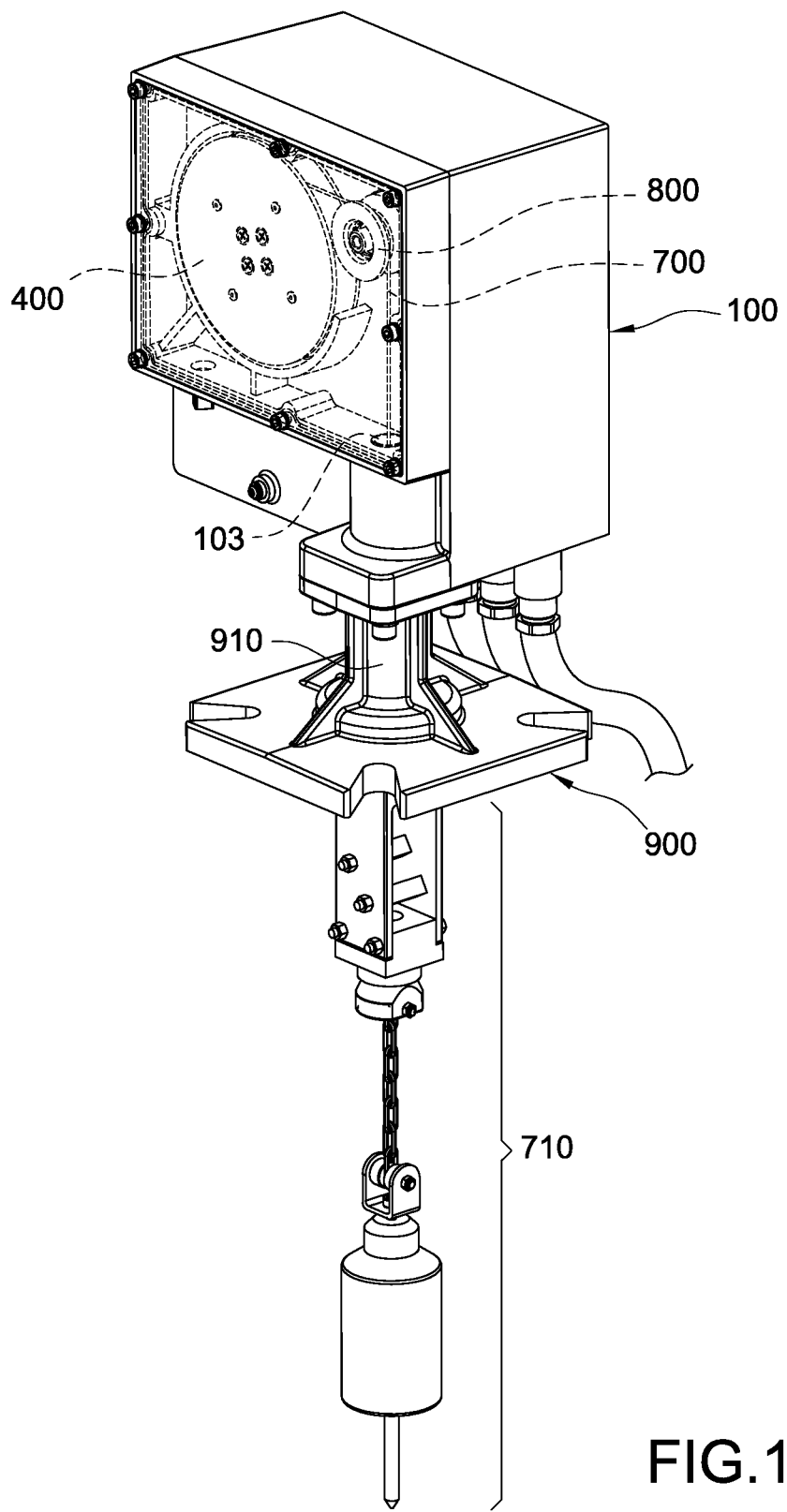
FIG. 1 is a perspective view showing the explosion-proof dust of electromechanical level measuring device according to one preferred embodiment of the present invention.
Figure 2:
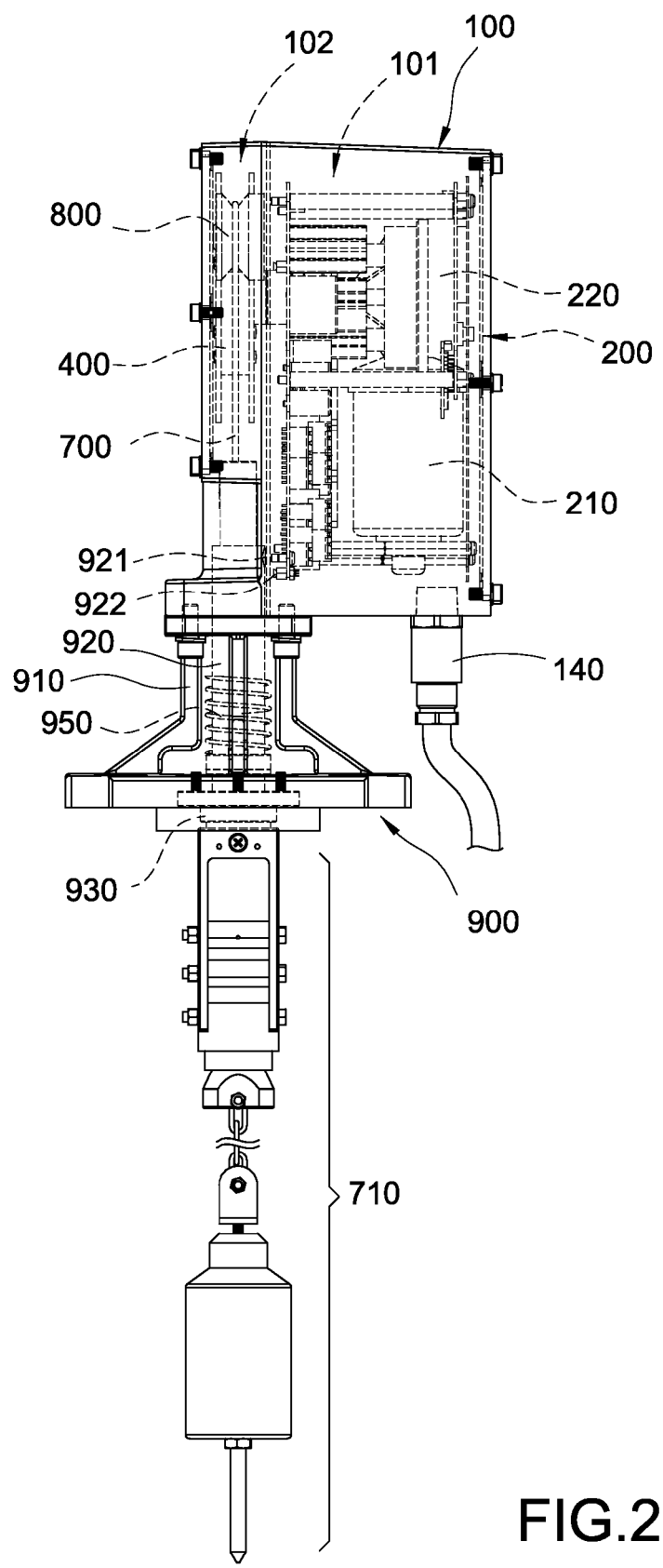
FIG. 2 is a side view showing the explosion-proof dust of electromechanical level measuring device according to one preferred embodiment of the present invention.

One preferred embodiment of the present invention will be described with reference to the drawings.

Please refer from FIG. 1 to FIG. 5, according to one preferred embodiment of the present invention, an explosion-proof dust of electromechanical level measuring device is used for measuring the storage level of storing objects stored in a storage space, wherein the storing objects are preferably to be liquids or powders or particles. The explosion-proof dust of electromechanical level measuring device includes a explosion proof enclosure (100), a power unit (200), a control module (300), a capstan (400), a power shaft (500), a pair of bearings (610, 620), a measuring cable (700), a counting wheel (800) and a sensing module (900).

The explosion proof enclosure (100) is provided with a partition plate (110), and two sides defined by the partition plate (110) in the explosion proof enclosure (100) are respectively formed as a sealed safe chamber area (101) and a non-sealed hazardous chamber area (102). The partition plate (110) is provided with a power shaft sleeve (120) which penetrates the partition plate (110) thereby communicating the safe chamber area (101) and the hazardous chamber area (102). The interior of the safe chamber area (101) is provided with a pair of position limiting units (131, 132). The explosion proof enclosure (100) is formed with a cable outlet (103) communicated with the hazardous chamber area (102). The explosion proof enclosure (100) is provided with at least an explosion proof cable gland (140), and each of the explosion proof cable glands (140) are respectively extended into the safe chamber area (101), what shall be addressed is that the scope of the present invention is not limited to the quantity of the explosion proof cable glands (140). The exterior of the explosion proof enclosure (100) is provided with a wireless module (150).

Figure 3:
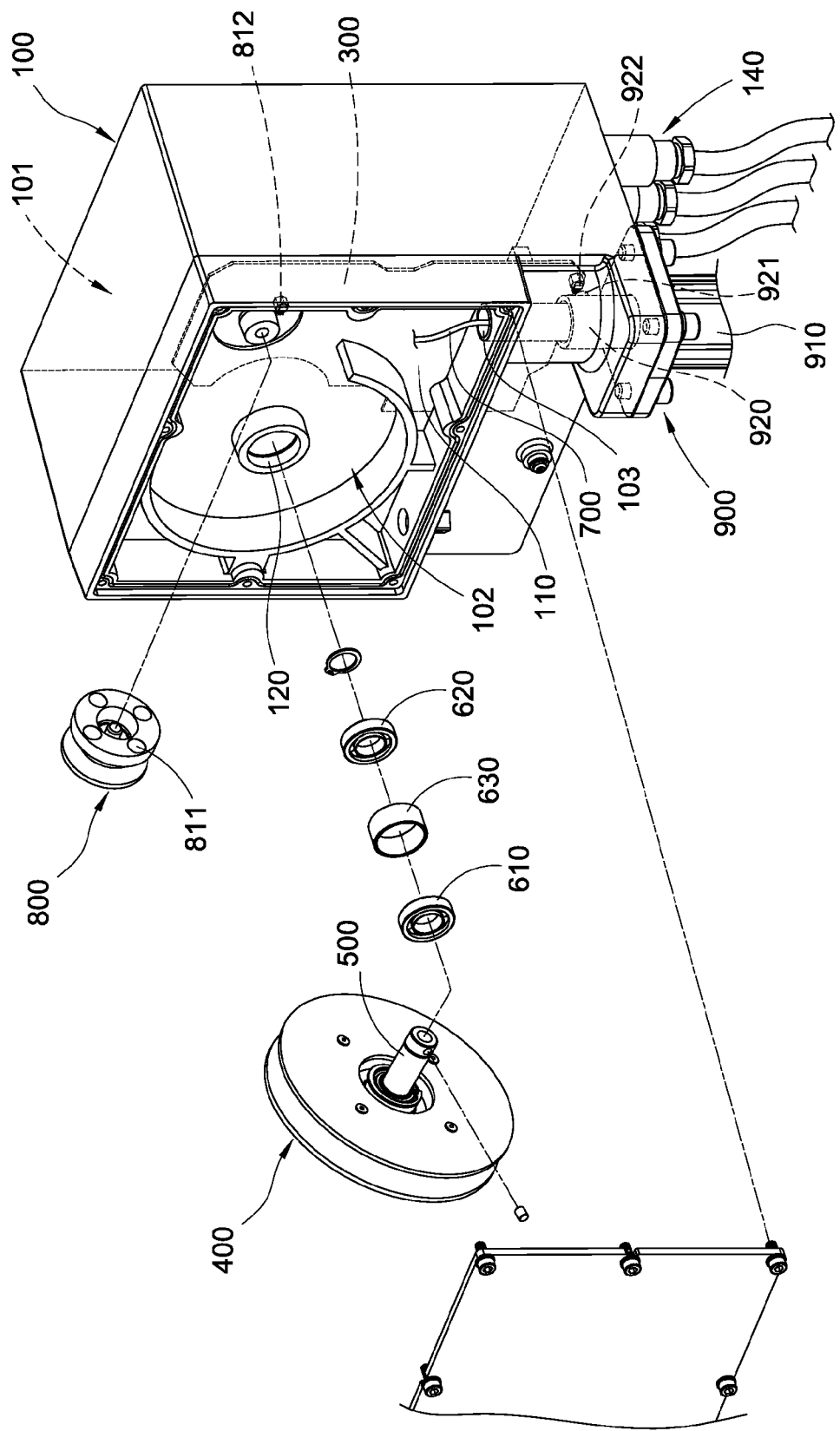
FIG. 3 is a perspective exploded view showing the explosion-proof dust of electromechanical level measuring device according to one preferred embodiment of the present invention.
Figure 4:
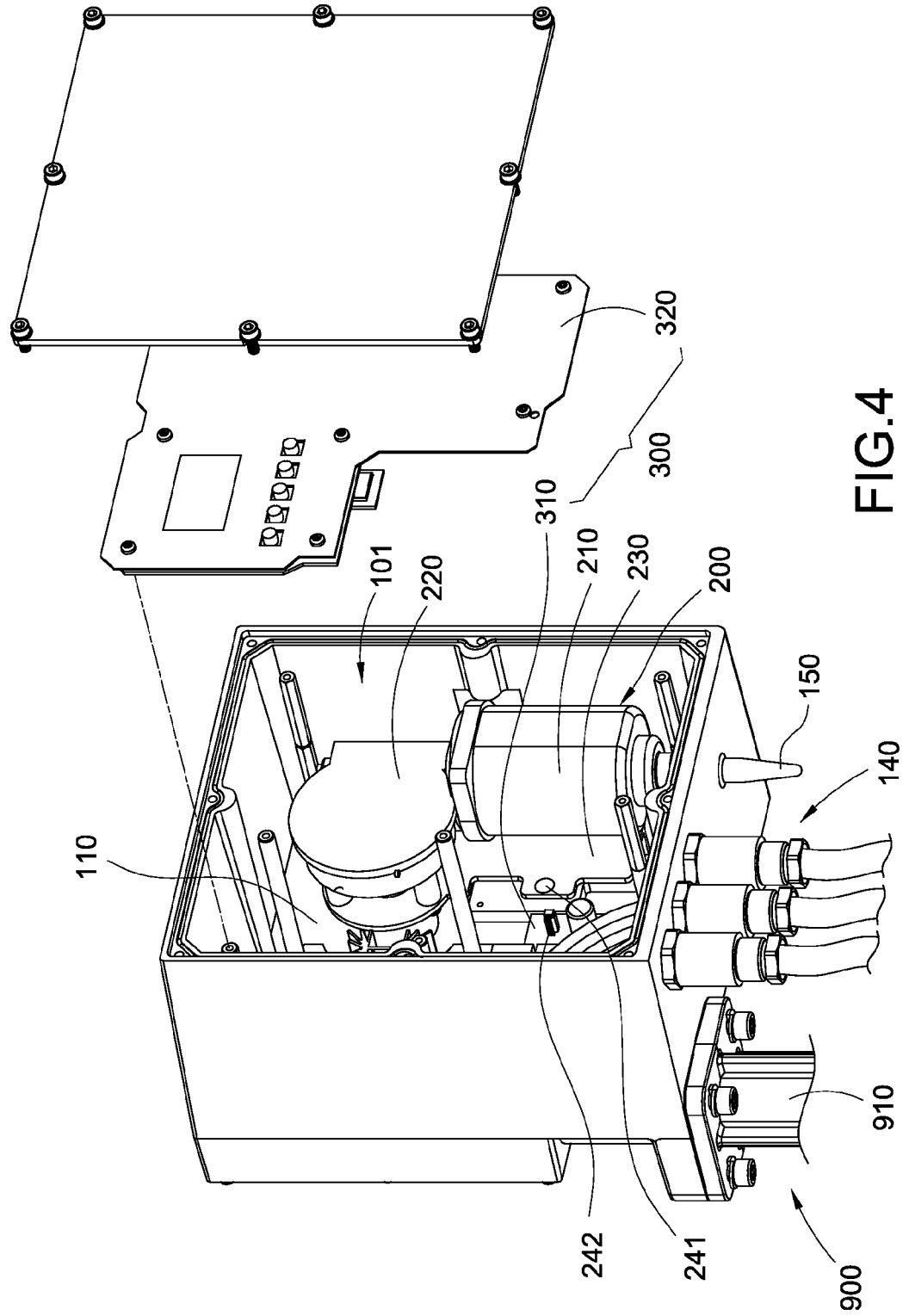
FIG. 4 is another perspective exploded view showing the explosion-proof dust of electromechanical level measuring device according to one preferred embodiment of the present invention.
Figure 5:
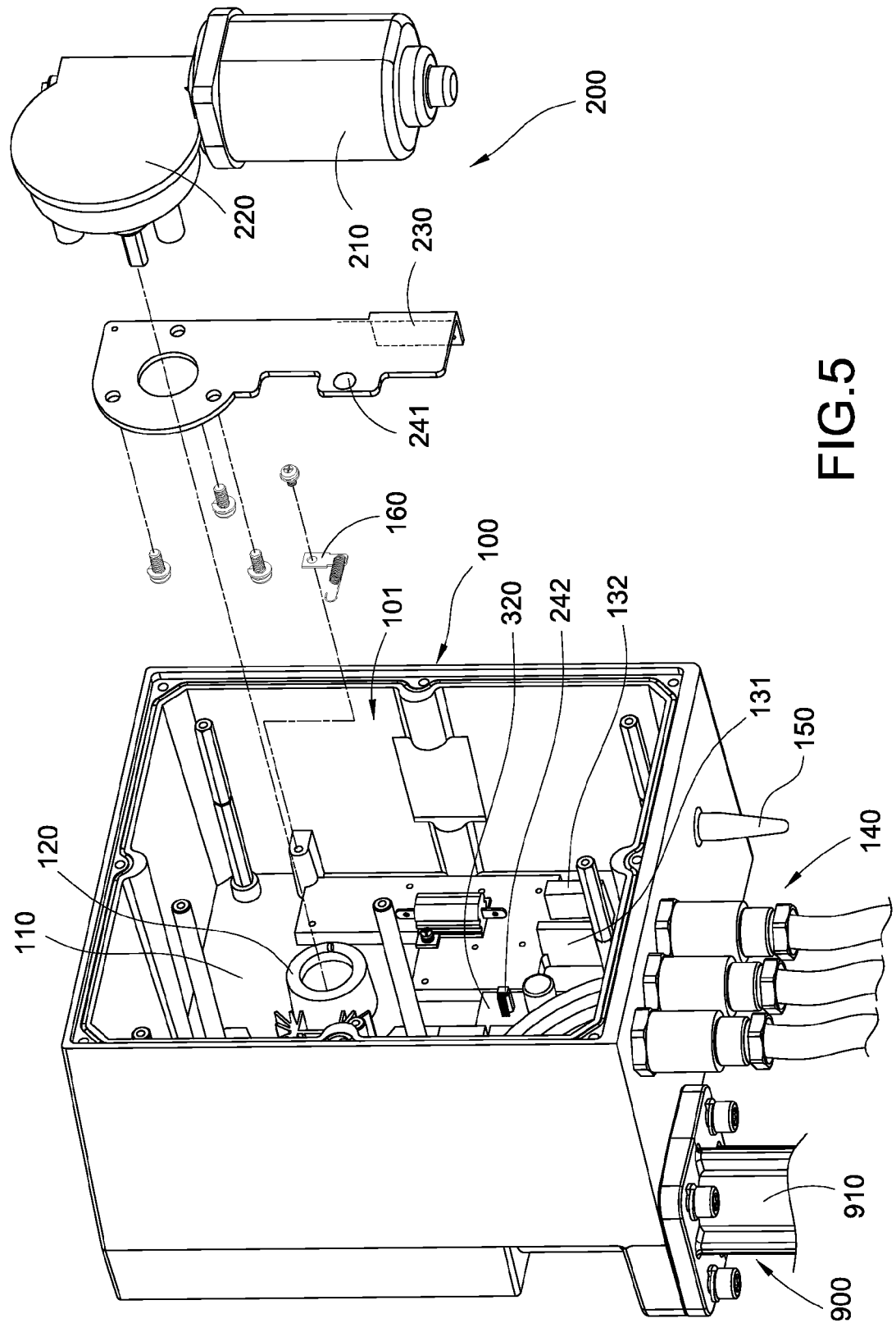
FIG. 5 is one another perspective exploded view showing the explosion-proof dust of electromechanical level measuring device according to one preferred embodiment of the present invention.
Figure 6:
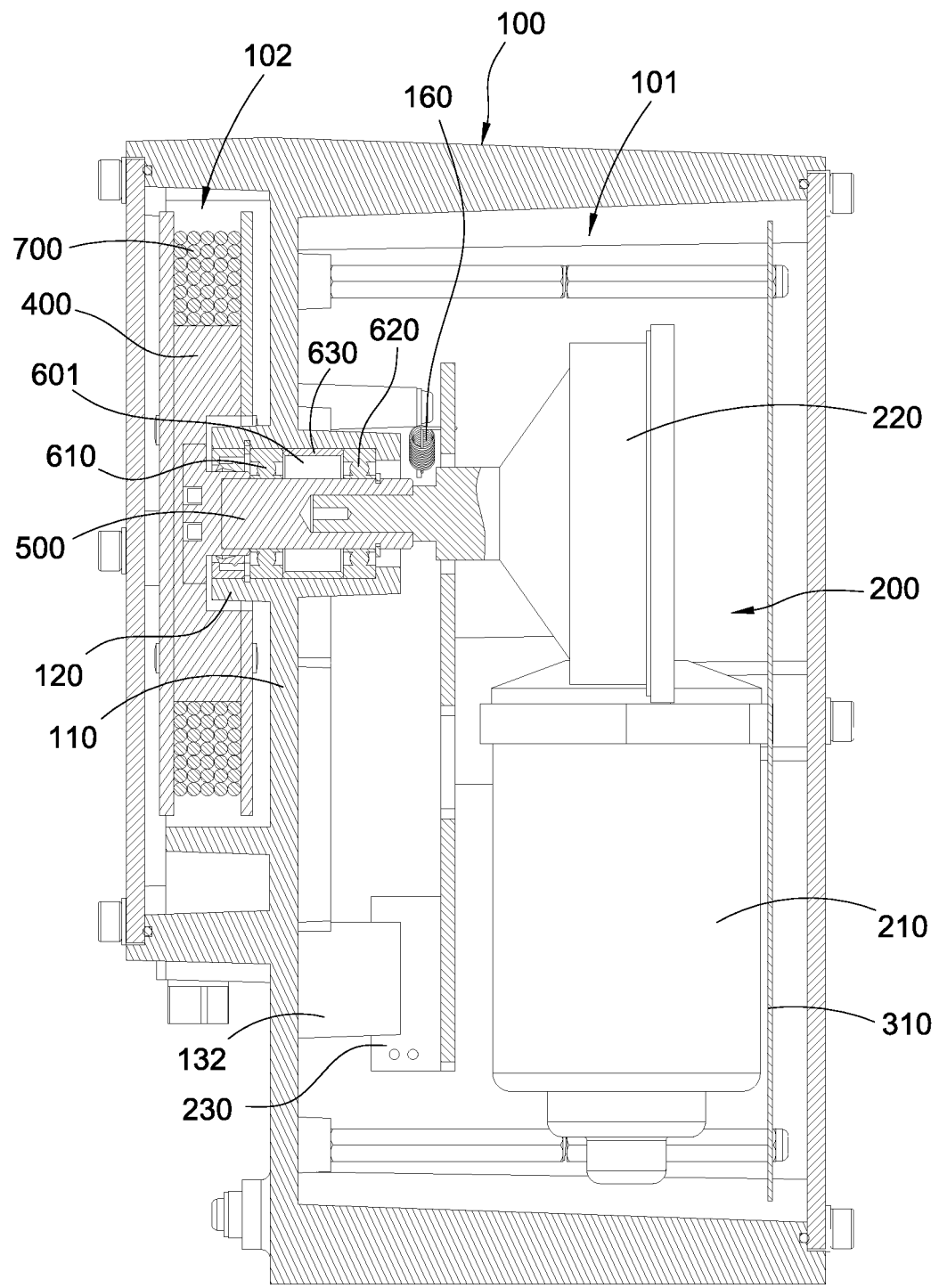
FIG. 6 is a cross sectional view showing the explosion-proof dust of electromechanical level measuring device according to one preferred embodiment of the present invention.

As shown from FIG. 3 to FIG. 5, the power unit (200) is disposed inside the safe chamber area (101) and includes a motor (210) and a reduction mechanism (220), wherein the reduction mechanism (220) is preferably to be a reduction gear, and the motor (210) is connected to the reduction mechanism (220) for driving the reduction mechanism (220). The reduction mechanism (220) is provided with a position limiting plate (230), and a part of the position limiting plate (230) is arranged between the pair of position limiting units (131, 132).

The control module (300) is disposed inside the safe chamber area (101), arranged adjacent to the power unit (200) and electrically connected to the power unit (200), thereby enabling the control module (300) to drive the power unit (200) for operation. Each of the above-mentioned explosion proof cable glands (140) and the wireless module (150) are respectively and electrically connected to the control module (300), thereby allowing the control module (300) to be externally controlled with a wired or wireless means. According to this embodiment, the control module (300) at least includes a first circuit board (310) and a PCB assembly (320) arranged in parallel with an interval, the PCB assembly (320) is disposed adjacent to the partition plate (110), and the power unit (200) is arranged between the first circuit board (310) and the PCB assembly (320), what shall be addressed is that the scope of the present invention is not limited to the above-mentioned arrangement.

Please refer from FIG. 3 and FIG. 6 to FIG. 9, the capstan (400) is disposed inside the hazardous chamber area (102), the power shaft (500) is sleeved in the power shaft sleeve (120), and two ends of the power shaft (500) are respectively connected to the reduction mechanism (220) and the capstan (400). The power unit (200) is able to drive the capstan (400) to rotate through the power shaft (500); and when the power unit (200) is in operation, the power unit (200) is enabled to swing with the power shaft (500) being a central axis. The position limiting plate (230) is able to swing with the power unit (200), so the pair of position limiting units (131, 132) can be served to stop the position limiting plate (230) thereby limiting the swing stroke of the power unit (200). The interior of the safe chamber area (101) is provided with a recovery spring (160), two ends of the recovery spring (160) are respectively connected to the position limiting plate (230) and an inner wall of the safe chamber area (101), so the elastic force provided by the recovery spring (160) is able to be used for pulling the position limiting plate (230) to drive the power unit (200) to be recovered. The power unit (200) is provided with a magnet (241), according to this embodiment, the magnet (241) is preferably to be disposed on the position limiting plate (230), and the PCB assembly (320) is provided with a corresponding Hall sensor (242), so the control module (300) is enabled to determine whether the power unit (200) being in an operating status through the Hall sensor (242) sensing the relative locations of the Hall sensor (242) and the magnet (241).

Figure 7:
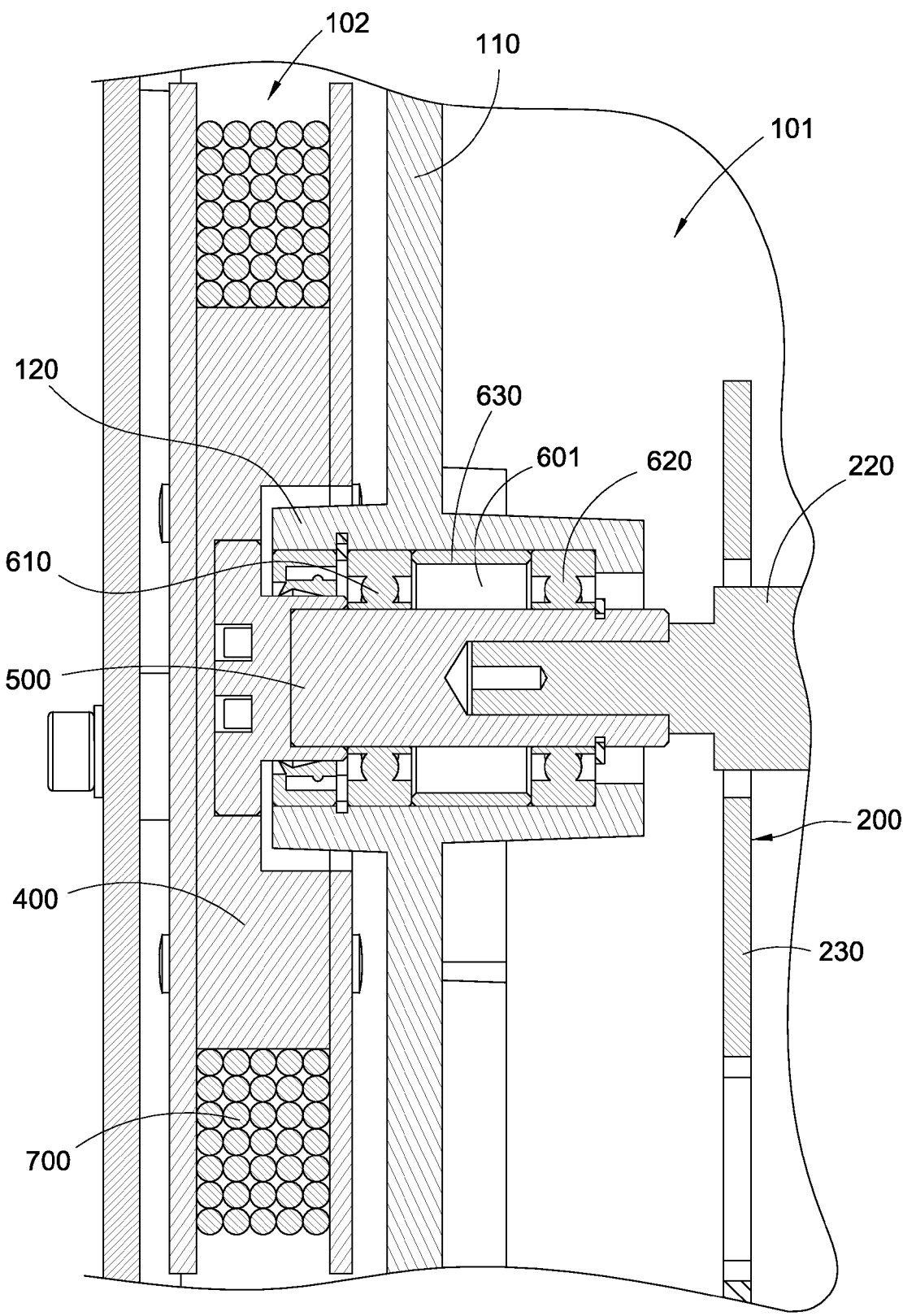
FIG. 7 is a partially enlarged view of FIG. 6 showing the explosion-proof dust of electromechanical level measuring device according to one preferred embodiment of the present invention.
Figure 8:
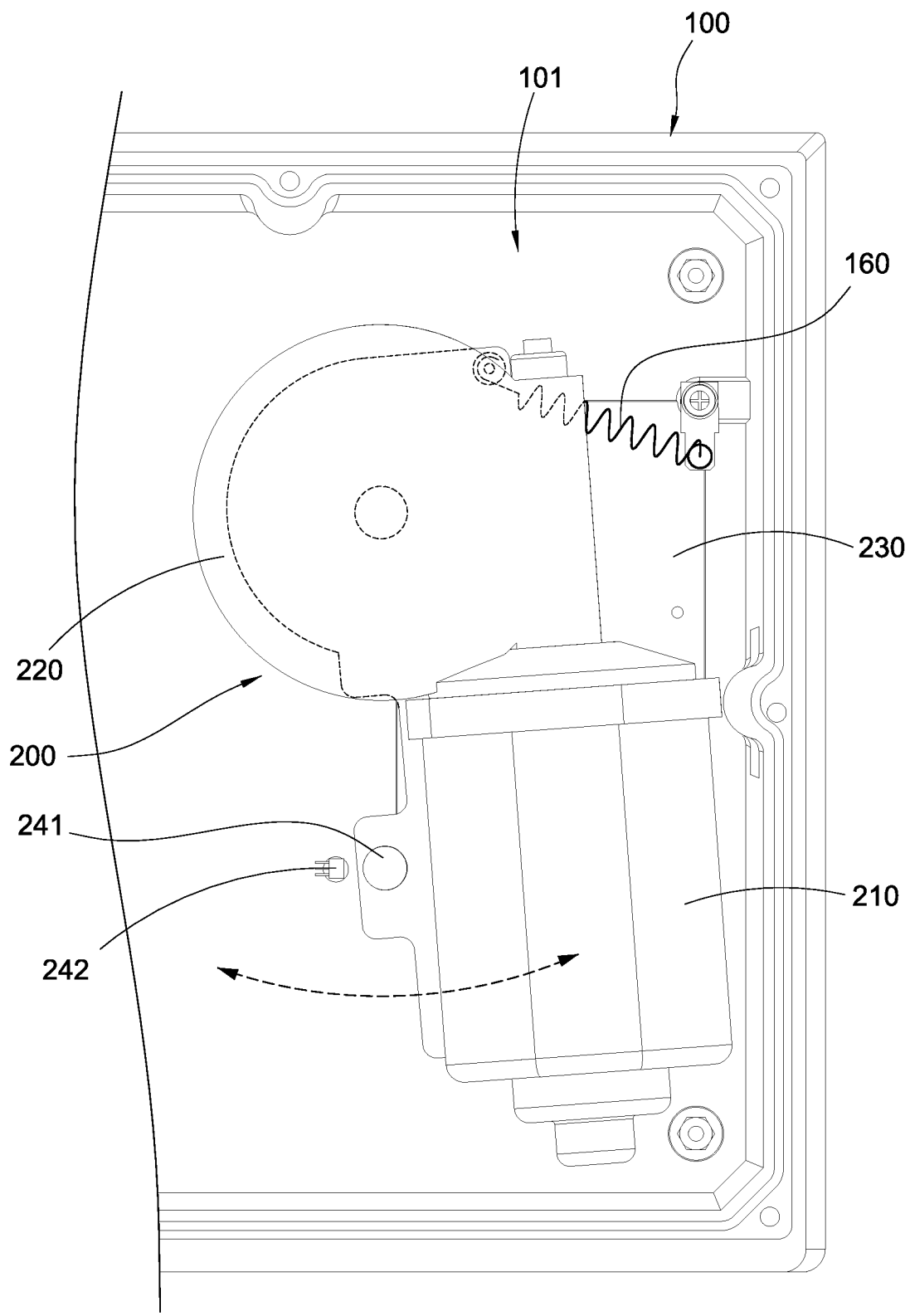
FIG. 8 is a schematic view showing the swing motion of the power unit according to one preferred embodiment of the present invention.
Figure 9:
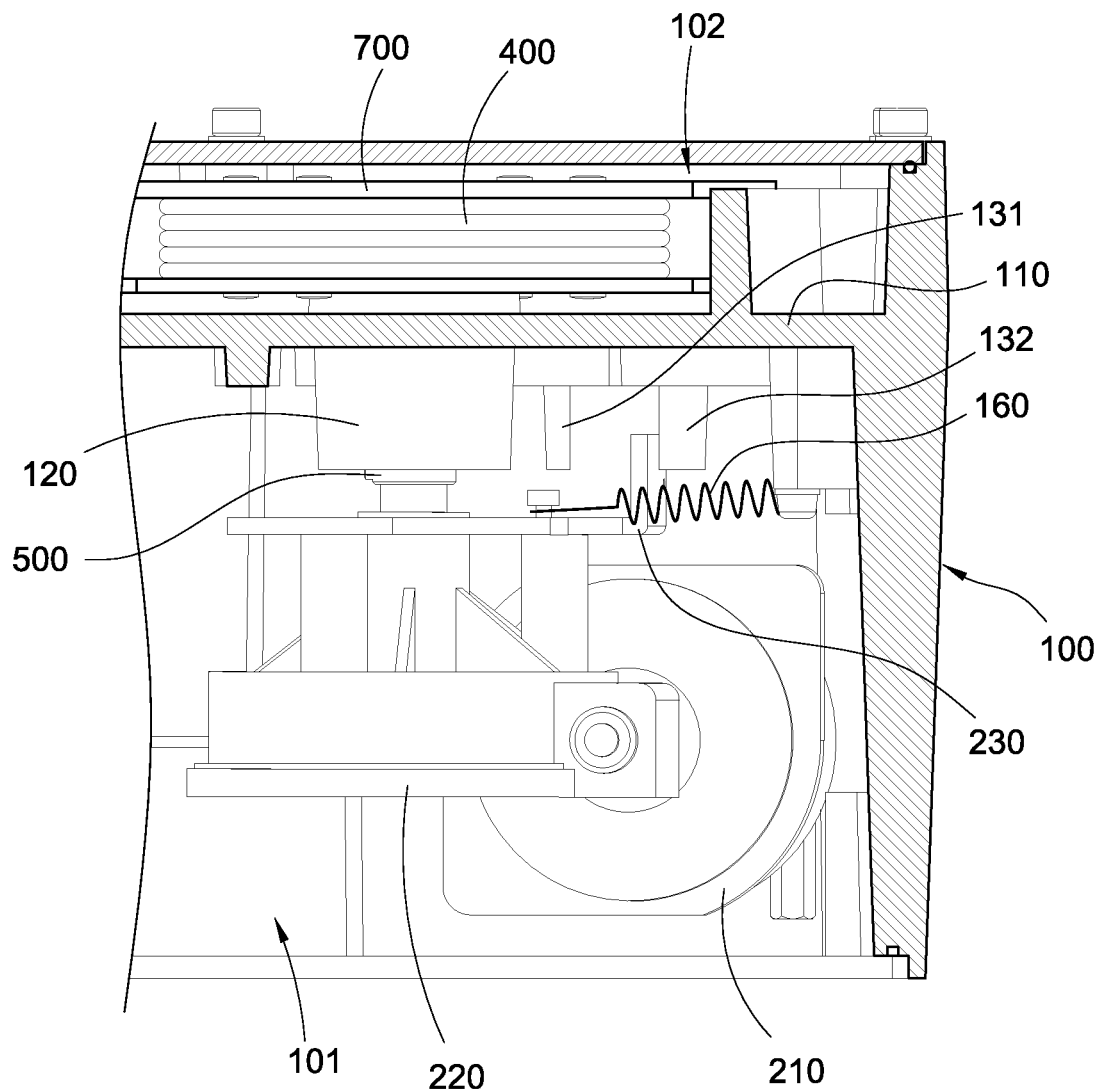
FIG. 9 is a schematic view showing the installation of the power unit according to one preferred embodiment of the present invention.
Figure 10:
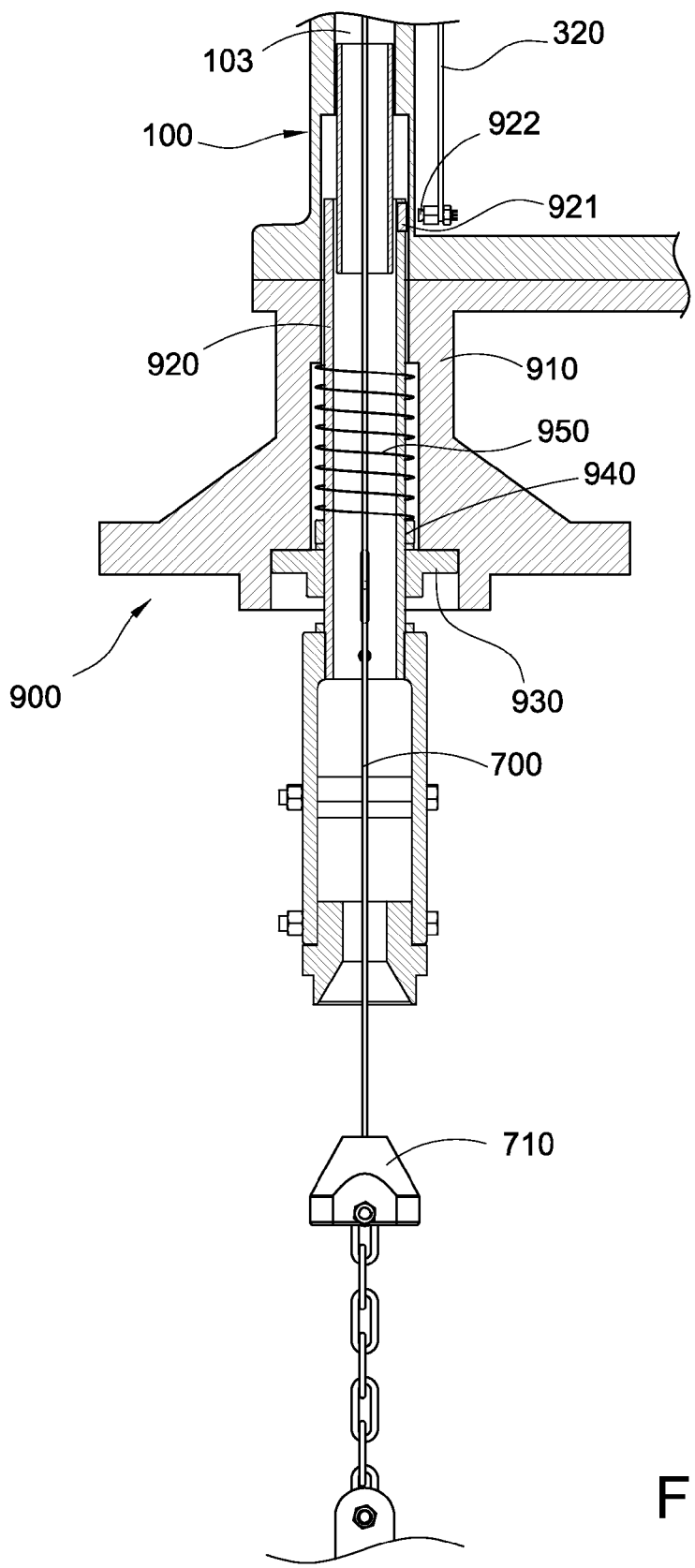
FIG. 10 is a schematic view showing the sensing module according to one preferred embodiment of the present invention.
Figure 11:
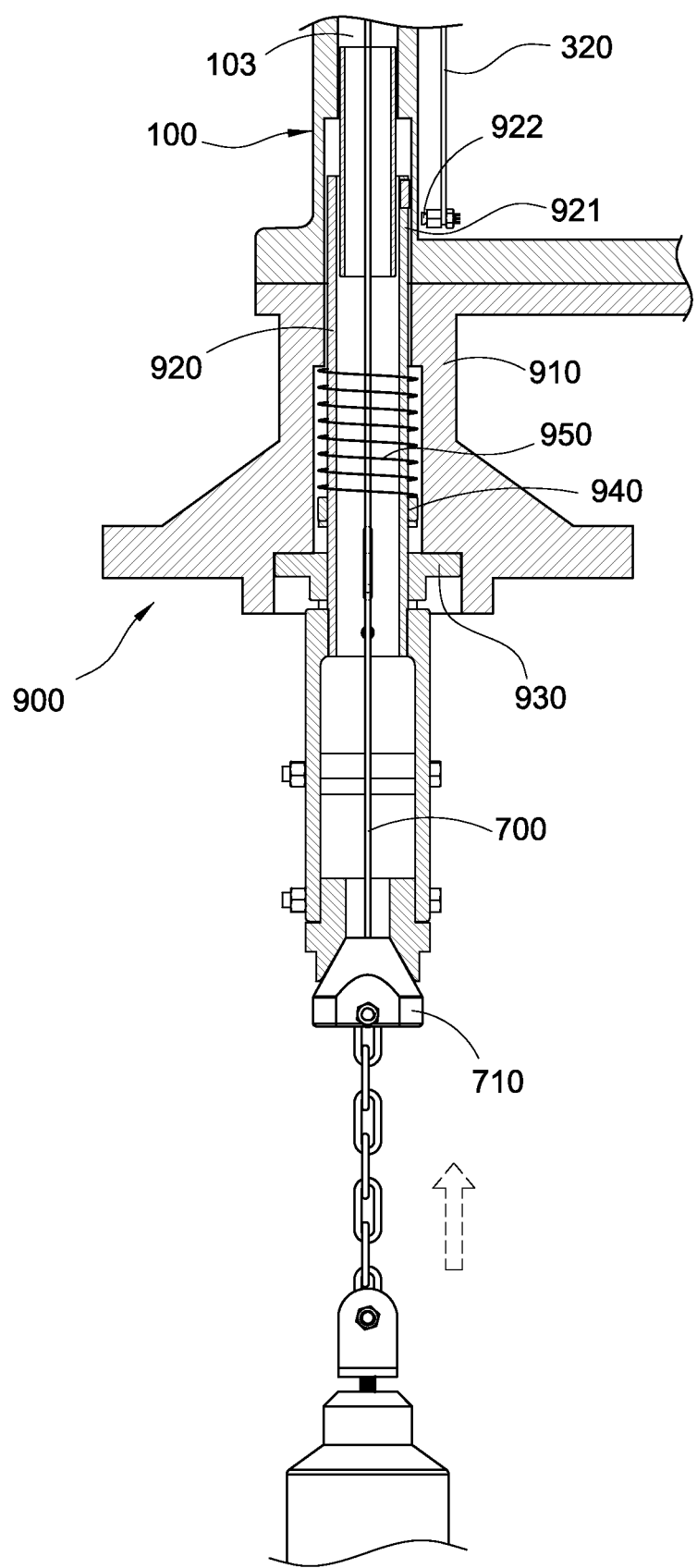
FIG. 11 is a schematic view showing the operation of the sensing module according to one preferred embodiment of the present invention.

As shown in FIG. 3 and FIG. 7, the bearings (610, 620) are disposed in the power shaft sleeve (120) and respectively sleeved with the power shaft (500), the interior of the power shaft sleeve (120) is further provided with a bearing sleeve (630), and two ends of the bearing sleeve (630) are respectively abutted against each of the bearings (610, 620) thereby allowing the pair of bearings (610, 620) to be spaced with an interval, so a fireproof path (601) is formed between the two bearings (610, 620). The fireproof path (601) is able to prevent powders or debris from entering the hazardous chamber area (102) thereby preventing the powders or debris from further entering the safe chamber area (101).

Please refer to FIG. 2 and FIG. 6 to FIG. 10, one end of the measuring cable (700) is reeled on the capstan (400), the measuring cable (700) passes the cable outlet (103) for being protruded out of the explosion proof enclosure (100), and the other end of the measuring cable (700) is provided with a plumb weight (710) thereby enabling the measuring cable (700) to be vertically and downwardly pulled by the plumb weight (710).

The counting wheel (800) is pivoted in the hazardous chamber area (102), and the mid portion of the measuring cable (700) is reeled on the counting wheel (800) for driving the counting wheel (800) to rotate. The counting wheel (800) is provided with a plurality of annularly-arranged magnets (811), and the magnets (811) are able to be circularly moved when the counting wheel (800) is rotated. The PCB assembly (320) is provided with a Hall sensor (812) corresponding to the moving path of the plural magnets (811). When the power unit (200) drives the capstan (400) to rotate for releasing the measuring cable (700), the measuring cable (700) is pulled by the plumb weight (710) for falling into the storage space, and the control module (300) is enabled to calculate the length of the released measuring cable (700) through the Hall sensor (812) sensing the frequency of the magnets (811) passing the Hall sensor (812). When the plumb weight (710) is in contact with the storing objects (if the storing objects are liquids, a buoy is required to be installed for assistance), the operation of the power unit (200) is stopped, and the storage level of the storing objects is able to be determined with respect to the length of the released measuring cable (700).

The sensing module (900) is disposed outside the explosion proof enclosure (100) and includes a flange assembly (910), a slide assembly (920) and a dustproof scraper (930). Two ends of the flange assembly (910) are opened and one end thereof is communicated with cable outlet (103). The slide assembly (920) is slidably sleeved in the flange assembly (910) and allows the measuring cable (700) to pass. One end of the slide assembly (920) is provided with a magnet (921), and the magnet (921) is able to slide with the slide assembly (920) into the hazardous chamber area (102). The PCB assembly (320) is provided with a Hall sensor (922) corresponding to the magnet (921). The dustproof scraper (930) is served to shield the other end of the flange assembly (910) and the slide assembly (920) is able to penetrate the dustproof scraper (930). When the slide assembly (920) is moved, the dustproof scraper (930) is able to remove the powders or debris adhered on the outer wall of the slide assembly (920). According to this embodiment, the outer wall of the slide assembly (920) is formed with a flange (940), when the plumb weight (710) is fallen, the slide assembly (920) is downwardly moved and the flange (940) is stopped by the dustproof scraper (930) thereby preventing the slide assembly (920) from being loosened.

Please refer to FIG. 2 and FIG. 6 to FIG. 11, when the power unit (200) drives the capstan (400) to rotate for allowing the measuring cable (700) to be fully reeled on the capstan (400), the plumb weight (710) pushes the slide assembly (920) and the magnet (921) on the slide assembly (920) is displaced relative to the Hall sensor (922), so the control module (300) is enabled to determine whether the measuring cable (700) to be fully reeled back through the Hall sensor (922) sensing the relative locations of the magnet (921) and the Hall sensor (922), and the operation of the power unit (200) is stopped when the measuring cable (700) is fully reeled back. According to this embodiment, a buffer spring (950) is provided in the flange assembly (910), and two ends of the buffer spring (950) are respectively abutted against the flange (940) and the inner wall of the flange assembly (910), so a buffering effect is provided when the plumb weight (710) is in contact with the slide assembly (920).

According to the explosion-proof dust of electromechanical level measuring device provided by the present invention, the fireproof path (601) is formed between the safe chamber area (101) and the hazardous chamber area (102), so the fireproof path (601) can be served to prevent the powders or debris generated by the storing objects from entering the safe chamber area (101) through the hazardous chamber area (102). As such, the powders or debris can be effectively prevented from being in contact with the operating or actuating power unit (200) or the control unit (300) thereby avoiding being ignited.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An explosion-proof dust of electromechanical level measuring device, including:
   a explosion proof enclosure (100), provided with a partition plate (110), wherein two sides defined by the partition plate (110) in the explosion proof enclosure (100) being respectively formed as a safe chamber area (101) and a hazardous chamber area (102), and the partition plate (110) being provided with a power shaft sleeve (120) penetrating the partition plate (110) thereby communicating the safe chamber area (101) and the hazardous chamber area (102);
   a power unit (200), disposed inside the safe chamber area (101);
   a control module (300), disposed inside the safe chamber area (101), wherein the control module (300) is disposed adjacent to the power unit (200) and electrically connected to the power unit (200);
   a capstan (400), disposed inside the hazardous chamber area (102);
   a power shaft (500), sleeved in the power shaft sleeve (120), wherein two ends of the power shaft (500) are respectively connected to the power unit (200) and the capstan (400); and
   a pair of bearings (610, 620), disposed in the power shaft sleeve (120) and respectively sleeved with the power shaft (500), wherein the pair of the bearings (610, 620) are spaced with an interval thereby forming a fireproof path (601) between the two bearings (610, 620).

2. The explosion-proof dust of electromechanical level measuring device according to claim 1, wherein a bearing sleeve (630) is provided in the power shaft sleeve (120) and two ends thereof are respectively abutted against each of the bearings (610, 620).

3. The explosion-proof dust of electromechanical level measuring device according to claim 1, wherein a surface of the power unit (200) is provided with a magnet (241), and the control module (300) is provided with a Hall sensor (242) corresponding to the magnet (241).

4. The explosion-proof dust of electromechanical level measuring device according to claim 1, wherein the power unit (200) is able to be rotated along the power shaft (500), the safe chamber area (101) is provided with a pair of position limiting units (131, 132), and the power unit (200) is provided with a position limiting plate (230), wherein a part of the position limiting plate (230) is arranged between the position limiting units (131, 132).

5. The explosion-proof dust of electromechanical level measuring device according to claim 4, wherein the interior of the safe chamber area (101) is provided with a recovery spring (160), and two ends of the recovery spring (160) are respectively connected to the position limiting plate (230) and an inner wall of the safe chamber area (101).

6. The explosion-proof dust of electromechanical level measuring device according to claim 1, wherein the explosion proof enclosure (100) is provided with an explosion proof cable gland (140) electrically connected to the control module (300).

7. The explosion-proof dust of electromechanical level measuring device according to claim 1, wherein the exterior of the explosion proof enclosure (100) is provided with a wireless module (150) electrically connected to the control module (300).

8. The explosion-proof dust of electromechanical level measuring device according to claim 1, wherein a measuring cable (700) and a counting wheel (800) are further provided, the explosion proof enclosure (100) is formed with a cable outlet (103) communicated with the hazardous chamber area (102), one end of the measuring cable (700) is reeled on the capstan (400), and the measuring cable (700) is reeled on the counting wheel (800) and passes the cable outlet (103) for being protruded out of the explosion proof enclosure (100), the other end of the measuring cable (700) is provided with a plumb weight (710), the counting wheel (800) is pivoted in the hazardous chamber area (102), the counting wheel (800) is provided with a plurality of annularly-arranged magnets (811), and the magnets (811) are able to be circularly moved when the counting wheel (800) is rotated, and the control module (300) is provided with a Hall sensor (812) corresponding to the moving path of the magnets (811).

9. The explosion-proof dust of electromechanical level measuring device according to claim 8, further including a sensing module (900) disposed outside the explosion proof enclosure (100), the sensing module (900) includes a flange assembly (910) and a slide assembly (920), wherein two ends of the flange assembly (910) are opened and one end thereof is communicated with the cable outlet (103), the slide assembly (920) is slidably sleeved in the flange assembly (910) and allows the measuring cable (700) to pass, one end of the slide assembly (920) is provided with a magnet (921) capable of being moved with the slide assembly (920) into the hazardous chamber area (102), and the control module (300) is provided with a Hall sensor (912) corresponding to the magnet (921).

10. The explosion-proof dust of electromechanical level measuring device according to claim 9, further including a scraper (930) served to shield the other end of the flange assembly (910) and the slide assembly (920) penetrating the scraper (930).

\* \* \* \* \*